United States Patent [19]

Hara

[11] Patent Number: 5,767,991

[45] Date of Patent: Jun. 16, 1998

[54] COLOR IMAGE READING DEVICE

[75] Inventor: Tomoshi Hara, Kanagawa, Japan

[73] Assignee: Fuji Xerox Co., Ltd., Tokyo, Japan

[21] Appl. No.: 423,095

[22] Filed: Apr. 18, 1995

[30] Foreign Application Priority Data

May 26, 1994 [JP] Japan .................................. 6-113039

[51] Int. Cl.⁶ .................................................. G03F 3/08
[52] U.S. Cl. ........................... 358/518; 358/520; 382/167
[58] Field of Search ................................... 358/518, 515, 358/512, 513, 523, 501, 520, 521, 527; 382/162, 165, 167

[56] References Cited

U.S. PATENT DOCUMENTS

| | | | |
|---|---|---|---|
| 4,887,151 | 12/1989 | Wataya | 358/520 |
| 5,157,506 | 10/1992 | Hannah | 358/298 |
| 5,185,661 | 2/1993 | Ng | 358/518 |
| 5,200,832 | 4/1993 | Taniuchi et al. | 358/527 |
| 5,270,808 | 12/1993 | Tanioka | 358/527 |
| 5,287,204 | 2/1994 | Koizumi et al. | 358/538 |
| 5,315,416 | 5/1994 | Taniuchi et al. | 358/520 |
| 5,481,380 | 1/1996 | Bestmann | 358/504 |
| 5,502,579 | 3/1996 | Kita et al. | 358/520 |
| 5,539,540 | 7/1996 | Spaulding et al. | 358/520 |

FOREIGN PATENT DOCUMENTS

| | | |
|---|---|---|
| 63-111767 | 5/1988 | Japan . |
| 63-208369 | 8/1988 | Japan . |

*Primary Examiner*—Edward L. Coles, Sr.
*Assistant Examiner*—Madeleine A. V. Nguyen
*Attorney, Agent, or Firm*—Finnegan, Henderson, Farabow, Garrett & Dunner, L.L.P.

[57] ABSTRACT

A color image reading device having a function of correcting a variation in the color separation characteristic for each device. In the color image reading device, a standard document is read to detect variations in the color separation characteristic, and on the basis of the detected values, the color separation characteristic is corrected by a color correction processing section provided at a stage after the color conversion unit. Thus, even if the color separation characteristic has a slight variation for each device, the variation can be corrected easily by reading the standard document as occasion requires.

6 Claims, 10 Drawing Sheets

COLOR IMAGE READING DEVICE

BACKGROUND OF THE INVENTION

1. Field of the Invention

The present invention relates to a color image reading device for reading a color document, and more particularly to a color image reading device having a function of correcting a variation in the color separation characteristic for each device.

2. Description of the Related Art

For example, in a color copier, a color document is read by a color image reading device which converts the color document into a color image signal. The color image signal is subjected to various kinds of signal processing and the resultant signal is supplied to an image output device which outputs the image corresponding to the color document on a sheet of paper.

FIG. 8 is a block diagram showing the schematic arrangement of a conventional color copier.

In the color copier, a document is placed on a document stand glass and illuminated by an illumination device. The light reflected from the document is imaged on a charged coupled device (CCD) color image sensor 21 through an imaging optical system. The CCD color image sensor 21 includes three linear CCD devices corresponding to the respective colors of red, green and blue. In the CCD color image sensor 21, the light reflected from the document is photo-electric converted into point-serial analog signals of red (R), green (G) and blue (B) which are to be outputted. The analog signals from the CCD color image sensor 21 are converted into digital signals by an analog-to-digital (A/D) converter 22. The digital signals from the A/D converter 22 are shading-corrected by a shading correction section 23. The shading-corrected signals are subjected to basic image processing including three-stages of color conversion by an equivalent neutral lightness section 24, first color conversion section 25 and second color conversion section 30, black creation by a black creation processing section 31, modulation transfer function (MTF) processing by a digital filter 32 and output tone correction by a recording system γ correction section 33. The resulting signals are subjected to the processing for regenerating the half-tone by a half-tone processing section 34 to create signals of yellow (Y), magenta (M), cyan (C) and black (B) which are supplied to a printer section 35. In the printer section 35, an image corresponding to the image of the document is printed on a sheet of paper.

In the conventional device as shown in FIG. 8, the color conversion coefficient of each of the color conversion sections 25 and 30 is selected so that the hue and tone of the image of the document can be faithfully regenerated. In this case, the color conversion coefficient is predetermined to a fixed value so that the color difference between the document and the copy is minimized.

However, such a color copier suffers from changes in development characteristic, transfer characteristic and the like, and has various kinds of variations for each device. For this reason, it is difficult to maintain a stabilized optimum color image. Further, in order that an operator can adjust the quality of the color image, he must have technical knowledge. As a result, it is difficult to effect color regeneration faithful to the document.

In view of these problems, Japanese Patent Unexamined Publication No. Sho. 63-208369 proposes a method for reading a specified pattern outputted on a sheet of paper by an image reading device to set color correction parameters. A concrete example of such a method includes a testing mode for setting the correction coefficients from blue, green and red to yellow, magenta, cyan and black in the color conversion section on the basis of the state of the print sample. This system, however, has several problems.

The first problem is inconvenience due to indifference of variations of the color separation characteristic of the image reading device itself when it reads the print sample. For example, when the image has variations due to malfunction of a certain portion of the image reading device, the operation parameter of the portion other than the portion leading to variations is varied forcibly so that an apparent variation-free image can be obtained. In this case, however, the portion other than the portion leading to the variations operates under an extreme operation condition. Such a thing is not preferable for the operation of the image reading device.

The second problem is inconvenience due to setting of color conversion coefficients. For evaluation of minimization of the color difference when finally viewed by naked eyes, an equivalent color space such as an L*u*v* system or an L*a*b* system is used. On the other hand, minimization of the difference among the main densities of the three primary inks (yellow, magenta and cyan) in re-setting the color conversion coefficients is insufficient as determination of the color conversion coefficient parameters. Minimization of the average color difference in a color regeneration range will deteriorate gray balance or make it difficult to correct a specified color, e.g., yellow. Further, setting of the color conversion coefficients requires very complicated processing using a memory and a dedicated central processing unit (CPU).

Further, in recent years, since the image reading device is used in a network system but not as a stand-alone machine, correction for the standard color signal on the network is also required. Thus, the correction within each device is required so as to minimize the color difference among the standard color signals inputted onto the network.

Furthermore, since the color separation characteristic of the image reading device has variations for each CCD image sensor, the optimum color correction coefficient cannot be determined uniquely. This makes it impossible to effect color regeneration faithful to the document.

Meanwhile, the color separation characteristic in color image reading depends on the relation between the spectral reflection factor characteristic of color material contained in a document and the system response of the image reading device in a system including the spectral sensitivity characteristic of a color sensor. FIGS. 9(a), 9(b) and 9(c) are graphs showing an example of the spectral reflection factor characteristic of each color material of cyan, magenta and yellow, respectively. FIGS. 10(a), 10(b) and 10(c) are graphs showing an example of the relative spectral sensitivity characteristic of red, green and blue in the color sensor, respectively. FIGS. 11(a), 11(b) and 11(c) are graphs showing the light wavelength distributions (shaded portions) contributing to the response of a red sensor for reading the cyan component of a document, the response of a green sensor for reading the magenta component and the response of a blue sensor for reading the yellow component.

The red (R) sensor, green (G) sensor and blue (B) sensor are used to read the density of each of the color materials of cyan, magenta, yellow in the document which constitute the complementary colors mainly.

However, since the spectral sensitivity characteristic of the sensor has variations as described above, the wavelength distribution of the light contributing to the response of each of the sensors will be changed.

The influence of the change in the spectral sensitivity characteristic in a sensor on the image reading device is remarkable in the variations of the output from the blue sensor in reading yellow (Y). The color regeneration of the hue range in green-yellow-red system which contains the yellow component in the document is problematic in image quality. The variations of the output is attributed to the variations of the characteristic that the spectral reflection factor of yellow and the relative spectral sensitivity of the blue sensor vary abruptly in the neighborhood of the wavelength of 500 nm. For example, when the relative spectral sensitivity of the blue sensor having a blue filter is deviated to the side of the shorter wavelength as indicated by dotted line A in FIG. 11(c), the output from the blue sensor is reduced greatly. In this case, if an image is formed using a document having a gray scale portion, the gray image formed will be colored.

In order to solve these problems, it is desired to reduce the variations of the spectral transmission factor characteristic of a color filter so that the variations in the color separation characteristic of the CCD sensor can be restricted. However, this is difficult because of complicated process of forming color filers.

Another practice of effecting color generation is disclosed in Japanese Patent Unexamined Publication No. Sho. 63-111767. In this practice, a standard document is inputted to an image reading device to determine the color correction coefficient so as to minimize the difference from a reference value. This practice, however, only minimizes the average color difference in a color regeneration range as described above. The practice will increase the color difference in another hue and deteriorate the gray balance for correction of the variations in the output of the blue sensor in reading yellow, and further requires a CPU for complicated calculation and a memory for storing data. If both the image reading device and printer have variations, it is difficult to cause the correction of the color conversion coefficient to absorb these variations.

SUMMARY OF THE INVENTION

An object of the present invention is to provide a color image reading device which can correct variations in the color separation characteristic in a simple structure.

In order to attain the above object, the invention provides a color image reading device having color conversion means for reading a color document by an image sensor to obtain signals in an RGB color display system and converting the signals into signals in an L*a*b* color display system, the color image reading device including: comparison means for comparing values of the signals in the L*a*b* color display system obtained by reading a standard document with predetermined reference values; and a color correction processing section which is provided at a stage after the color conversion means and whose input/output characteristic is controlled in accordance with an output from the comparison. means.

Further, the invention provides a color image reading device including: image reading means having an RGB color filter for color separation of a document; separation means for separating the document into signals in an RGB color display system; conversion means for converting the signals in the RGB color display system into signals in an L*a*b* color display system; correction means for correcting the signals in the L*a*b* color display system; and means for changing a correction coefficient of the correction means in accordance with a difference between an output obtained by reading a standard document by the image reading means and a previously set reference value.

The above and other objects and features of the present invention will be more apparent from the following description taken in conjunction with the accompanying drawings.

DETAILED DESCRIPTION OF THE PREFERRED EMBODIMENTS

Figure 1:
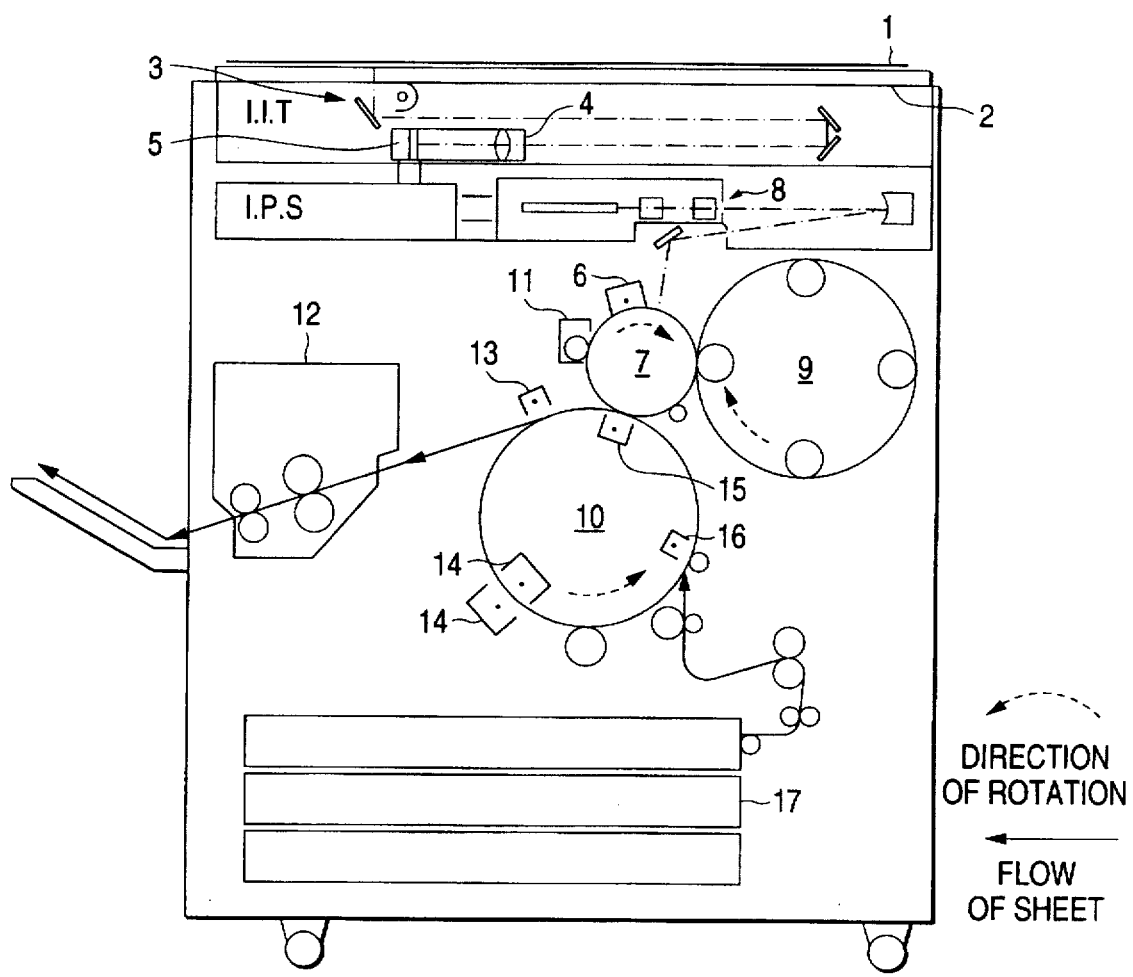
FIG. 1 is a view showing the schematic construction of a color copier to which the color image reading device according to the invention is applied.

Now, referring to the drawings, an embodiment of the present invention will be explained below.

Figure 2:
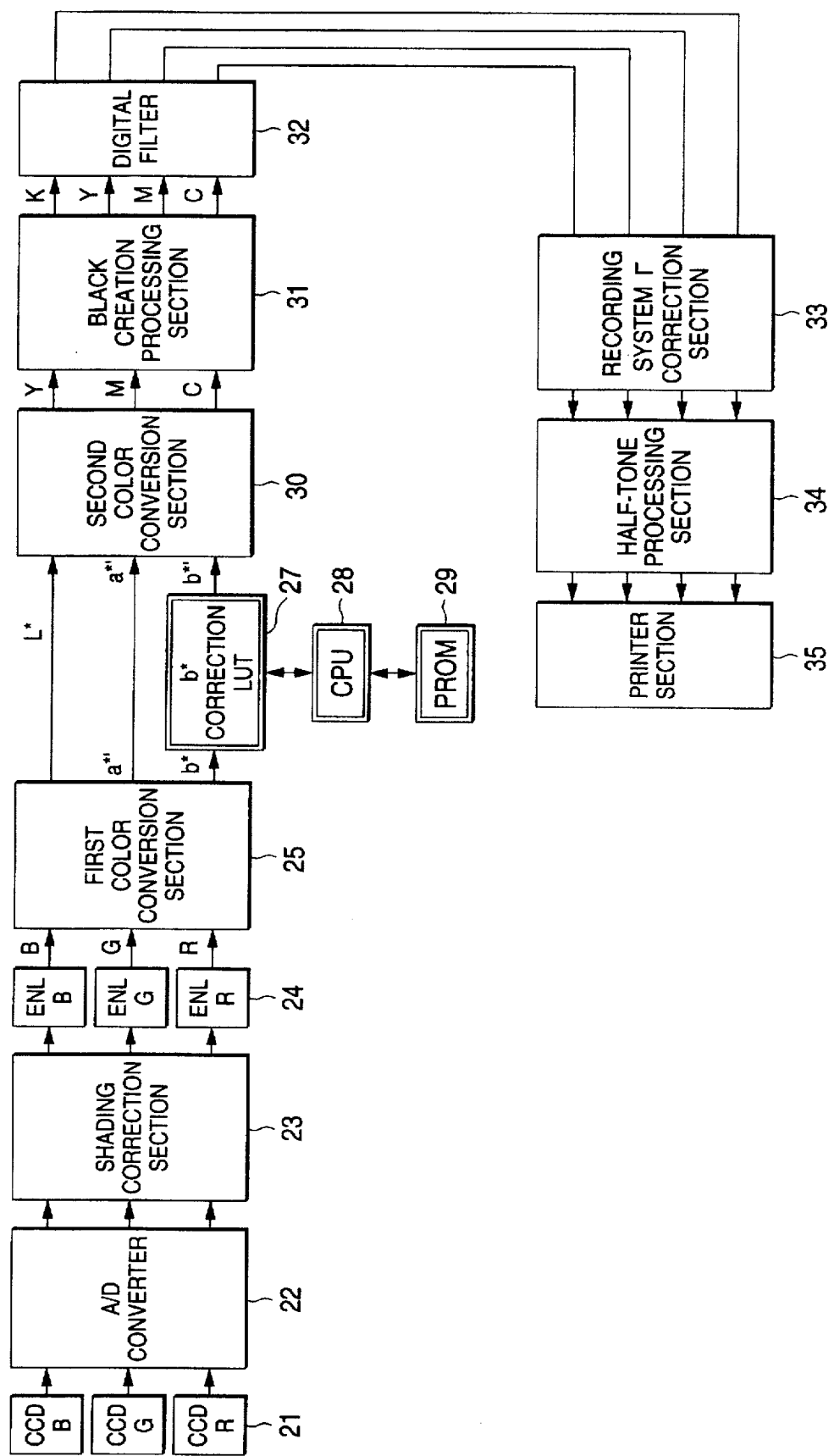
FIG. 2 is a block diagram showing the image processing section of the color copier as shown in FIG. 1.

FIG. 1 is a view showing the schematic construction of a color copier to which the color image reading device according to the invention is applied, and FIG. 2 is a block diagram showing the image processing section of the color copier as shown in FIG. 1.

In FIG. 1, reference numeral 1 designates a document; 2, a document stand glass on which the document 1 is placed; 3, a document illumination device; 4, an imaging lens; and 5, a small-sized type CCD color image sensor.

First, the copying process will be explained. When a copy start key (not shown) is pressed, the illumination device 3 illuminates the document 1 so that the light reflected from the document is imaged on the CCD color image sensor 5 through a reducing optical system including a mirror and an imaging lens. The CCD color image sensor 5 includes three linear CCD devices corresponding to the respective colors of red, green and blue. In the CCD color image sensor 5, the light reflected from the document is photo-electric converted into point-serial analog signals of red (R), green (G) and blue (B) which are to be outputted. As shown in FIG. 2, the analog signals from the CCD color image sensor 5 are converted into digital signals by an A/D converter 22. The digital signals from the A/D converter 22 are shading-corrected by a shading correction section 23. The shading-corrected signals are subjected to basic image processing including several kinds of color conversions by an equivalent neutral lightness conversion section 24, first color conversion section 25 and second color conversion section 30, black creation by a black creation processing section 31, modulation transfer function (MTF) processing by a digital filter 32 and output tone correction by a recording system γ-correction section 33. The resulting signals are subjected to the half-tone regenerating processing by a half-tone processing section 34 to create yellow (Y), magenta (M), cyan (C) and black (B) signals which are supplied to a printer section 35. The printer section 35 includes an image forming device by an electrophotographic system having main components of a laser scanning optical system 8 and a photoreceptor drum 7.

The digital signals of the image thus obtained are written on the photoreceptor drum 7 negatively charged in advance by a charging corotron as shown in FIG. 1 by a laser scanning optical system 8 through a screen generator incorporated in the half-tone processing section 34, and an electrostatic latent image is formed on the photoreceptor drum 7.

The electrostatic latent image thus formed is developed by a rotary developing unit 9 serially performing development of four colors. The developed image is transferred on a copy sheet of paper supplied from a paper tray 17 and wound on a transfer drum 10, and the toner remaining on the photoreceptor drum 7 is scraped by a cleaner 11.

This process from charging to transferring is repeated four times for black, yellow, magenta and cyan, and the resultant image is outputted as a color copy through a fusing device 12.

An detailed explanation will be given of the operation of the image processing section shown in FIG. 2.

The blue, green and red color-separated image signals from the reduced type CCD color image sensor 21 are converted into digital signals by the A/D converter 22. The digital signals are subjected to white-level correction by the shading correction section 23. Subsequently, the image reflection factors of blue, green and red are converted from the reflection factor data ref (B, G, R) to the lightness data enL (B, G, R) by the equivalent lightness conversion section 24. The lightness data are supplied to the first color conversion section 25.

In the first color conversion section 25, the RGB signals are subjected to masking processing so as to be converted into standard color signals L*a*b*. The L*a*b* color space is referred to a uniform perception color space. Where the signals L*, a* and b* are represented by 8 bits, respectively, it is assumed in this circuit that (L*, a*, b*) =(255, 128, 96) represents white and (L*, a*, b*)=(0, 128, 96) represents black.

The outputs L* and a* from the first color conversion section 25 are supplied directly to the second color conversion section 30 while the output b* from the first conversion section 25 is supplied to the second color conversion section 30 through a b* correction look-up table (LUT) 27. The look-up table 27 is connected to a CPU 28. The CPU 28 makes the following processing for the b* output in accordance with the program stored in a PROM (programmable read-only-memory) 29.

Figure 3:
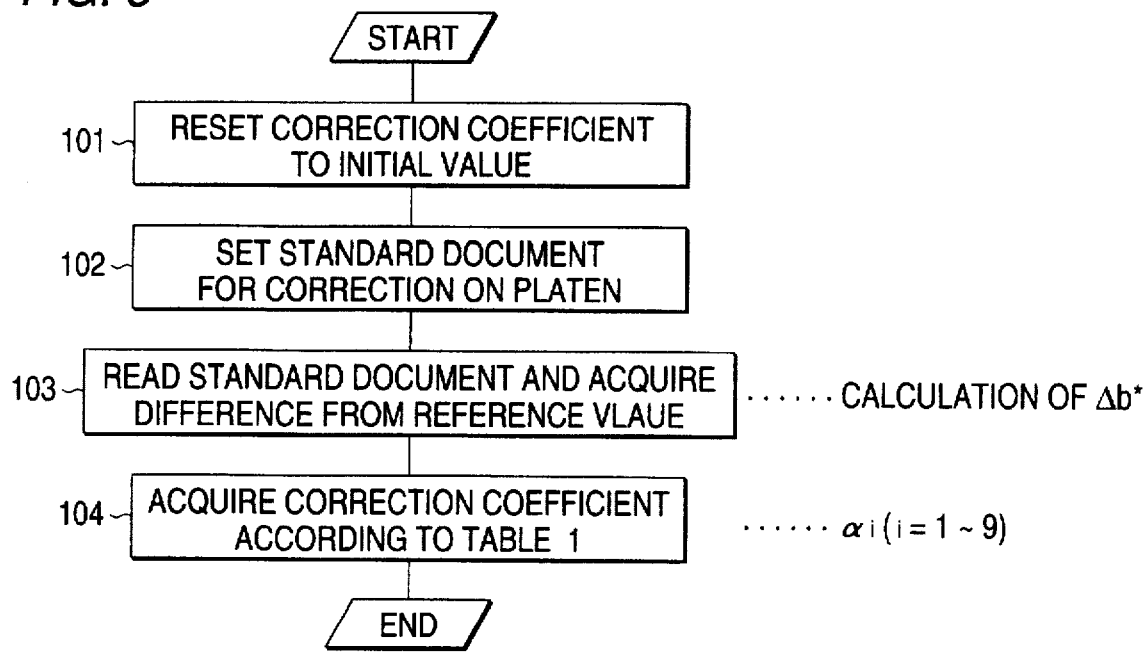
FIG. 3 is a flowchart showing the procedure of determining a correction coefficient.

In this embodiment, using the b* correction look-up table 27, the values of the L*, a* and b* signals obtained by color-signal conversion will be corrected in accordance with the following procedure. The flowchart showing the procedure of determining correction coefficients is shown in FIG. 3.

1. Procedure of detecting color separation characteristic of image reading device In detecting the color separation characteristic in the image reading device, in response to an instruction from an image reading starting section (not shown), a predetermined color patch area within a standard document for correction is read. Prior to the operation of detecting the color separation characteristic in the image reading device, the correction coefficient of the look-up table 27 is reset to an initial value by the CPU 28 (step 101).

A standard document for correction is placed on the document stand glass 2 (step 102), and the start of the operation of detecting the color separation characteristic is instructed from the image reading starting section. Then, the document illumination device 3 is moved to the predetermined color patch area within the standard document so that the color patch area of the standard document is exposed to light by the illumination source. The light reflected from the color patch area is imaged on the color image sensor 21. The color image sensor 21 produces the RGB signals. The RGB signals are subjected to the image processing as described above to provide the L*a*b* data after the first color conversion. In the operation, the correction coefficient is set for a reference coefficient (initial value).

When variations of the blue sensitivity in the color image sensor 21 are detected, the color patch within the standard document is a yellow patch which is complementary to blue. Likewise, green and red correspond to the patches of magenta and cyan, respectively.

2. Correction method The correction of the blue sensitivity in the color image sensor 21 is performed on the basis of the result of comparison between the predetermined standard value ($L_b*a_b*b_b*$) and the read value ($L_y*a_y*b_y*$) of the yellow patch within the standard document.

Figure 4:
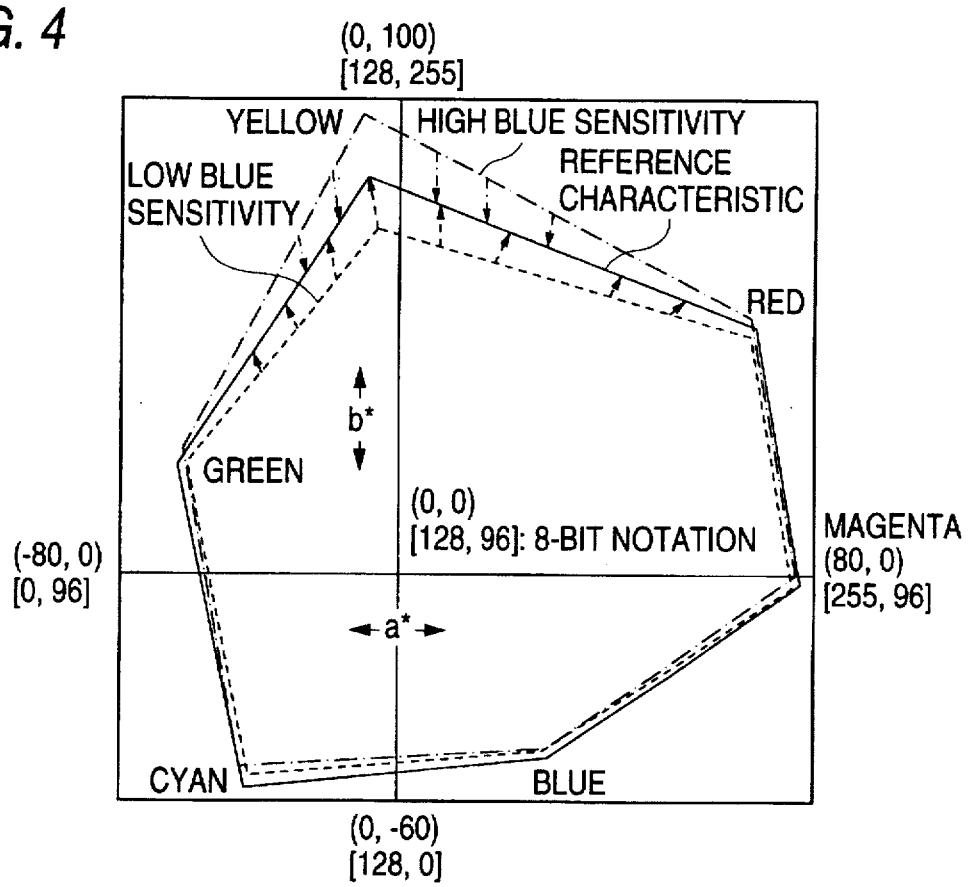
FIG. 4 is an L*a*b* chromaticity diagram showing changes in the chromaticity characteristic when the blue sensitivity of the color image sensor is changed.

FIG. 4 is an L*a*b* chromaticity diagram showing changes of the chromaticity characteristic when the blue sensitivity of the color image sensor 21 is changed. The abscissa represents an a* axis and the ordinate represents a b* axis. In FIG. 4, the solid line indicates the reference characteristic, the dotted line indicates the characteristic when the blue sensitivity is low and the one-dotted chain line indicates the characteristic when the blue sensitivity is high. As seen from FIG. 4, a change in the blue sensitivity leads to a large change in the yellow output. In other words, the difference of the yellow patch from the reference characteristic on the L*a*b* space is dominant in the value of the b* output. Therefore, the variations of the blue sensitivity can be detected from $\Delta b* = b_b* - b_y*$ (step 103). The value of $\Delta b*$ can be calculated by the CPU 28. If $\Delta b*$ exceeds a correction permitting range, the correction will not be performed but a notice of the fact that the correction could not be performed is displayed on a display device (not shown) for a user.

The respective correction coefficients as shown in Table 1 for the detected $\Delta b*$ values are previously stored as a look-up table in the PROM 29 (step 104).

TABLE 1

| Δb* | Correction Coefficient |
|---|---|
| −TH4 ≧ Δb* | α9 |
| −TH3 ≧ Δb* > −TH4 | α8 |
| −TH2 ≧ Δb* > −TH3 | α7 |
| −TH1 ≧ Δb* > −TH2 | α6 |
| TH1 ≧ Δb* > −TH1 | α5 |
| TH2 ≧ Δb* > TH1 | α4 |
| TH3 ≧ Δb* > TH2 | α3 |
| TH4 ≧ Δb* > TH3 | α2 |
| Δb* > TH4 | α1 |

Figure 5:
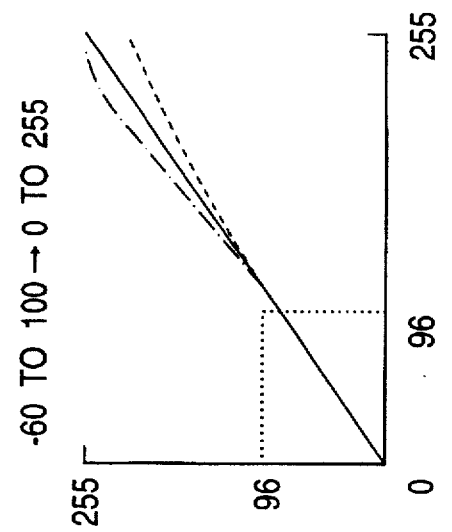
FIGS. 5(a) to 5(c) are views for explaining the procedure of making a look-up table.
Figure 5:
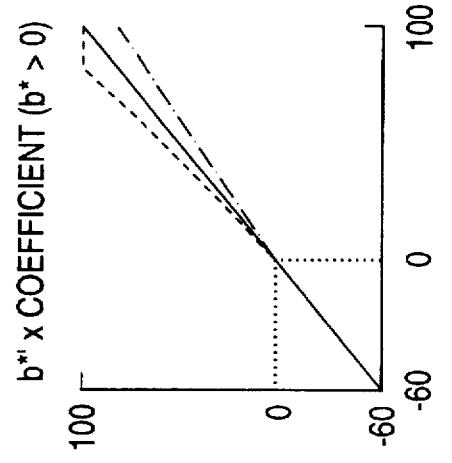
Figure 5:
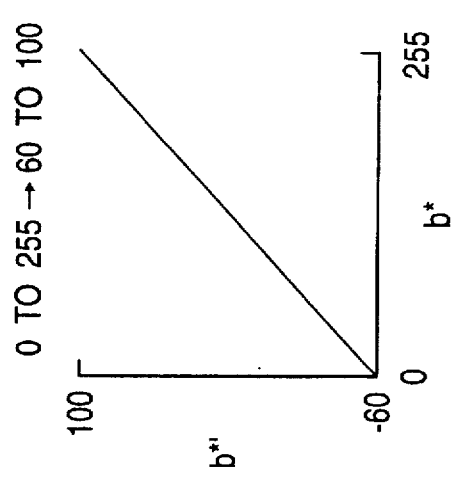

In correction by the look-up table 27, only the area b*≧0 is multiplied by the correction coefficients. In this embodiment, as described above, b* is expressed by "0 to 255" of 8-bit data. As seen from FIG. 5(a), "0 to 255" are caused to correspond to "−60 to 100" so that "96" in "0 to 255" corresponds to "0" in "−60 to 100". Therefore, the data of "96" and larger will be corrected. Specifically, as shown in FIG. 5(b), the abscissa is converted from "0 to 255" into "−60 to 100", and only the area of "0" and larger is multiplied by the correction coefficients. The CPU 28 performs the computation of b*×αi (i : one of 1 to 9) for only the area of b*≧0. As seen from FIG. 5(c), for both ordinate and abscissa, "−60 to 100" is converted into "0 to 255" to form the data for the look-up table. The data thus formed are stored in the look-up table 27.

3. Usual copying

In the usual copying, the document to be copied is placed on the document stand glass 2, and the usual copying starting button (not shown) is pressed down. The document illumination device 3 moves to scan the entire surface of the document. The light reflected from the document is imaged on the color image sensor 21. The color image sensor 21 produces RGB signals. The RGB signals are serially processed by the respective sections of the image processing unit as described above. The resultant signals are sent to the printer section 35. Then, the look-up table 27 is set to have such a characteristic as correcting changes in the blue sensitivity in the color image sensor 21. Therefore, correction can be made only on the yellow reading density which should be intrinsically corrected, to minimize the influence to the gray balance and the other hues, in particular, cyan and blue.

In this embodiment, the correction has been made using the look-up table. This correction, however, may be made by a comparator and a multiplier so as to apply the correction coefficients acquired as described in accordance with the value of b* in the usual copying.

Figure 6:
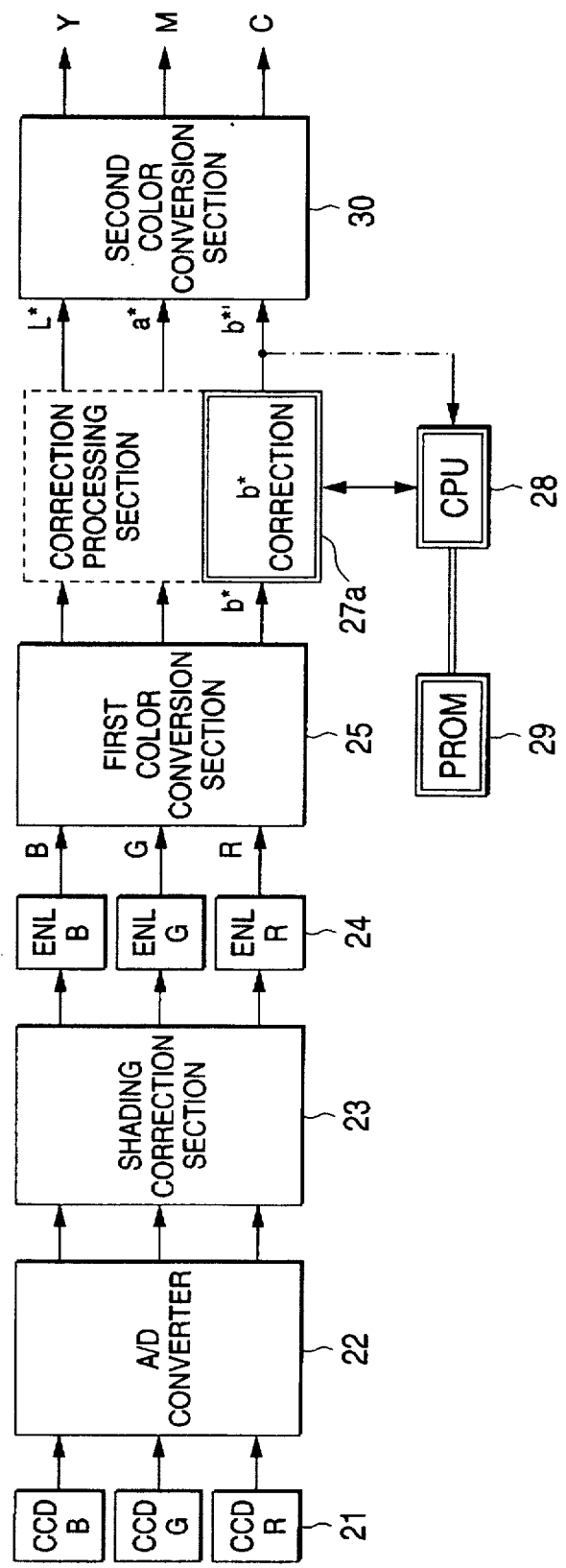
FIG. 6 is a block diagram showing the arrangement of the image processing section when the look-up table is not used.
Figure 7:
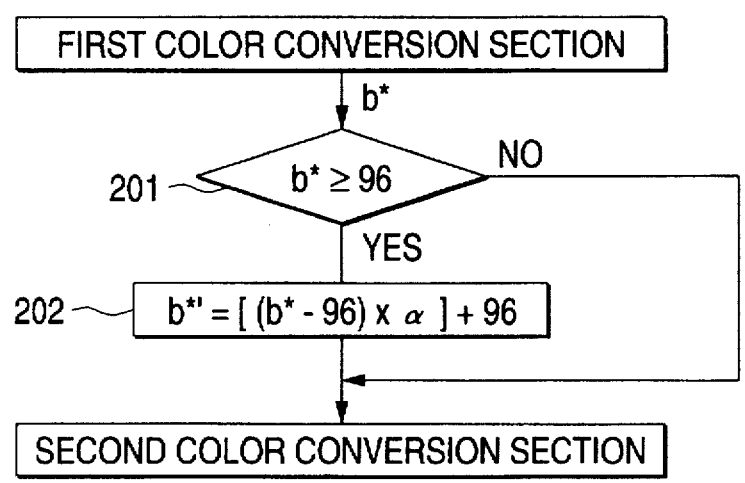
FIG. 7 is a flowchart showing the correcting operation in a usual copying operation when the look-up table is not used.
Figure 8:
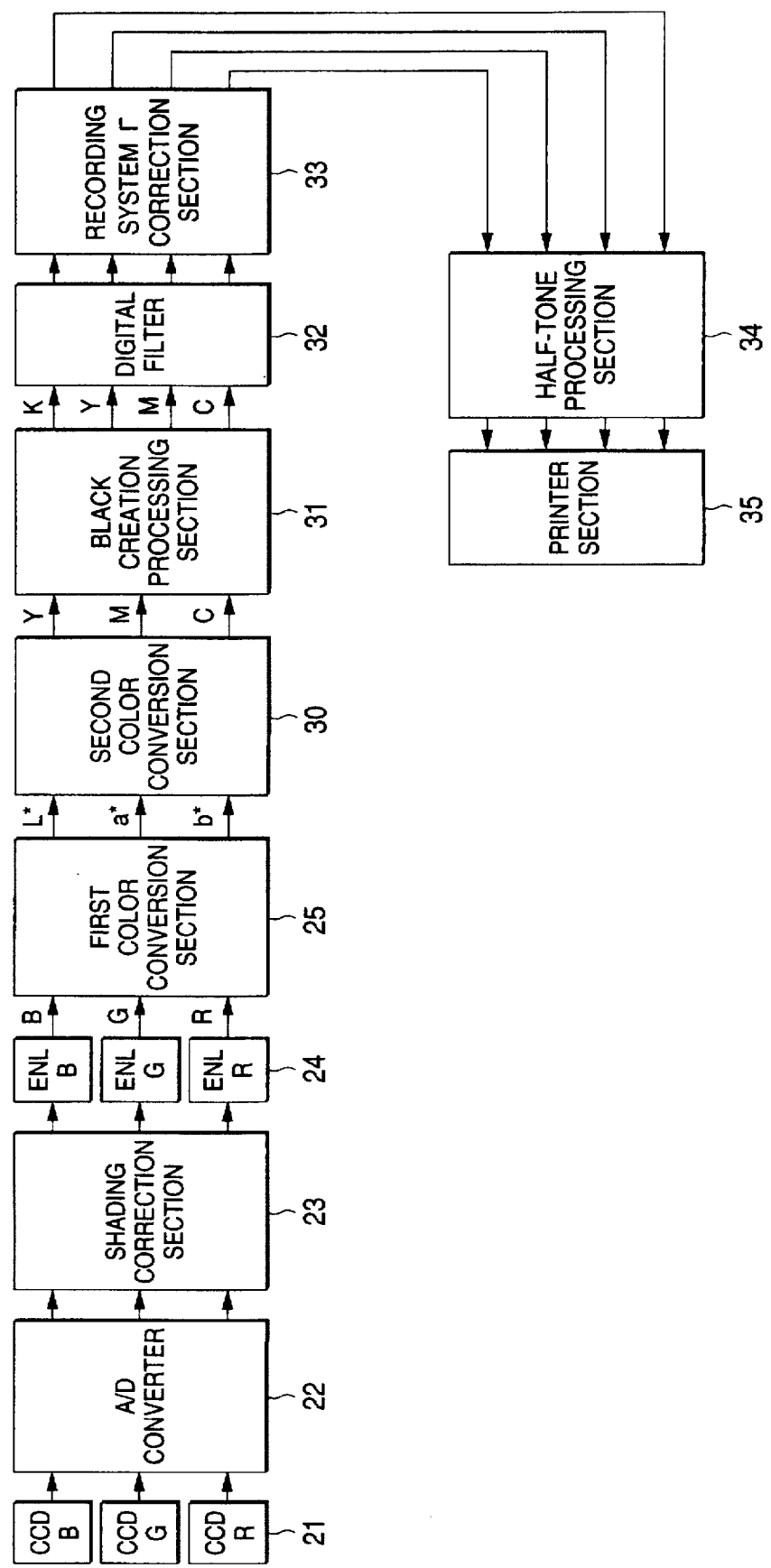
FIG. 8 is a block diagram showing a conventional color copier.
Figure 9:
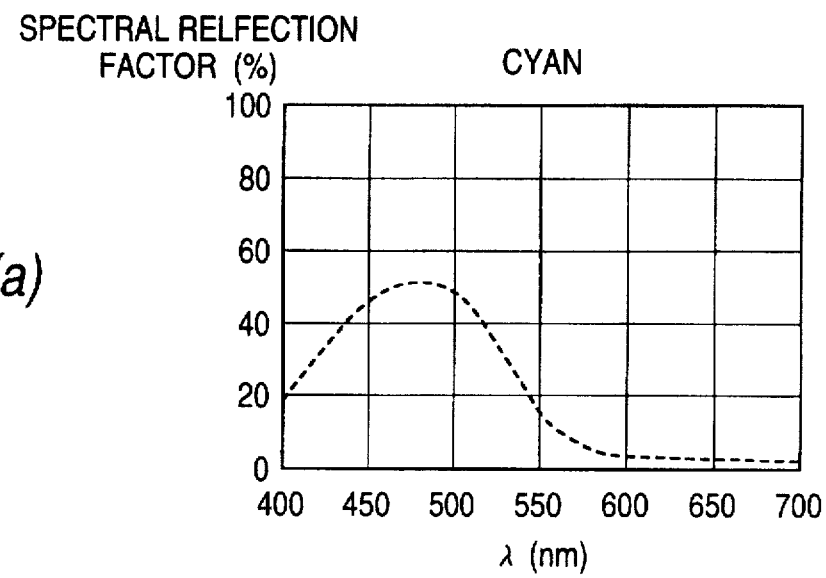
FIGS. 9(a), 9(b) and 9(c) are graphs showing an example of the spectral reflection factor characteristic of each color material of cyan, magenta and yellow, respectively.
Figure 9:
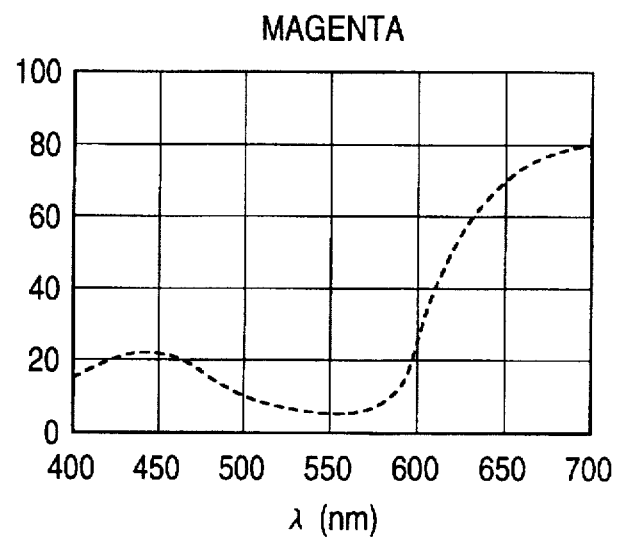
Figure 9:
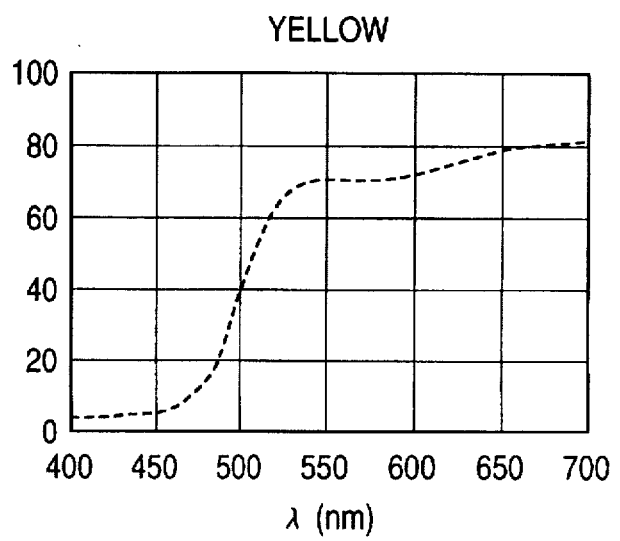
Figure 10:
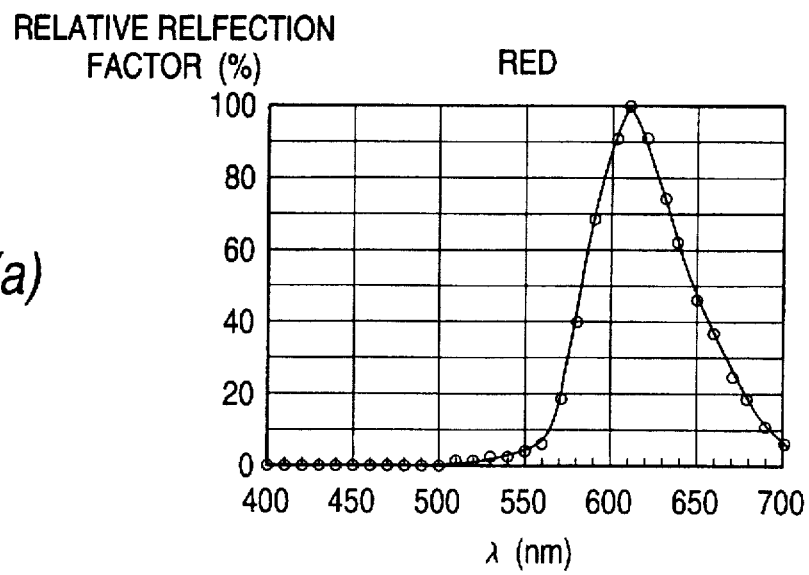
FIGS. 10(a), 10(b) and 10(c) are graphs showing an example of the relative spectral sensitivity characteristic of red, green and blue in the color sensor, respectively.
Figure 10:
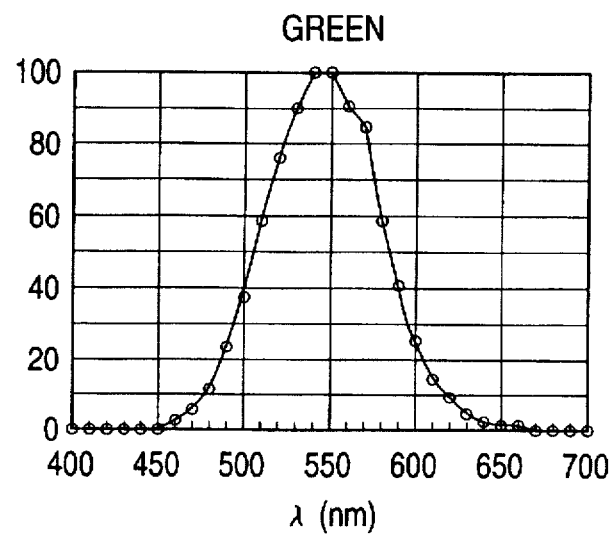
Figure 10:
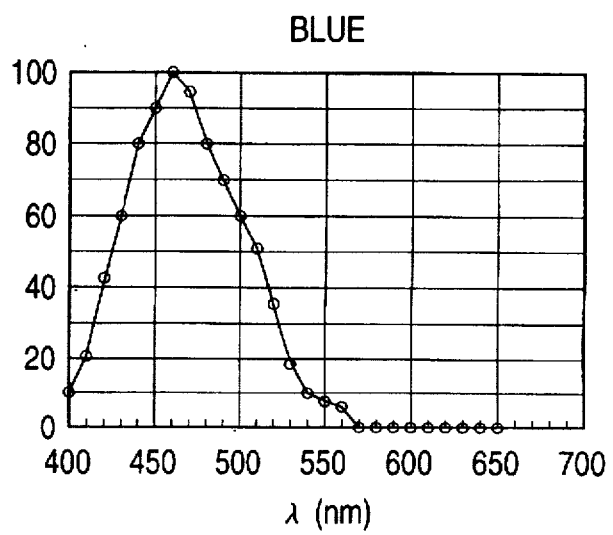
Figure 11:
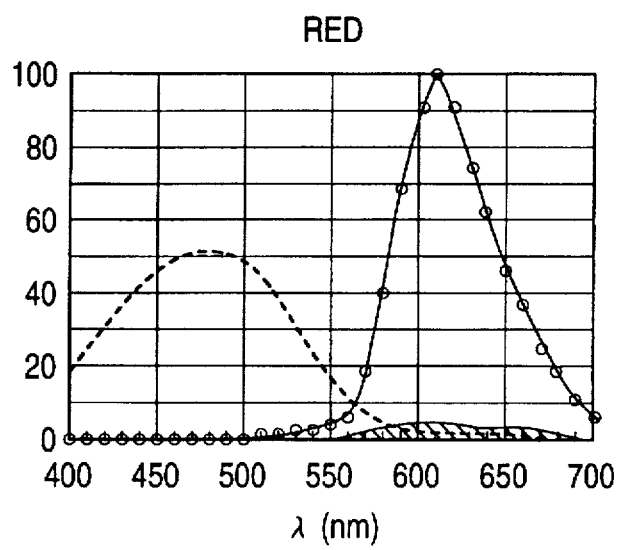
FIGS. 11(a), 11(b) and 11(c) are graphs showing the light wavelength distributions contributing to the response of a red sensor for reading the cyan component of a document, the response of a green sensor for reading the magenta component and the response of a blue sensor for reading the yellow component.
Figure 11:
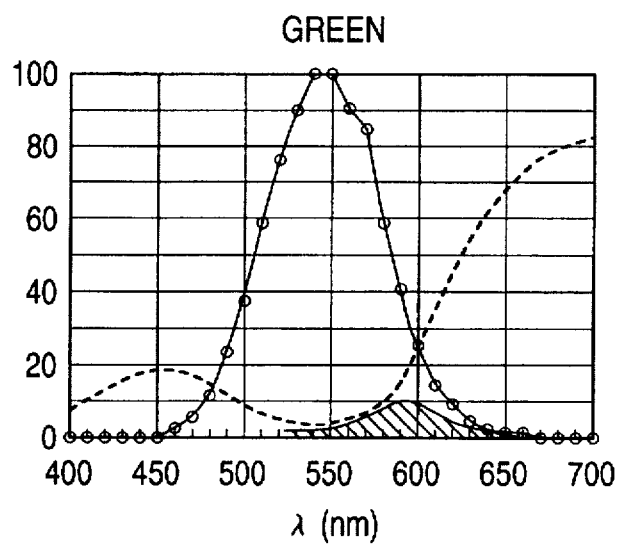
Figure 11:
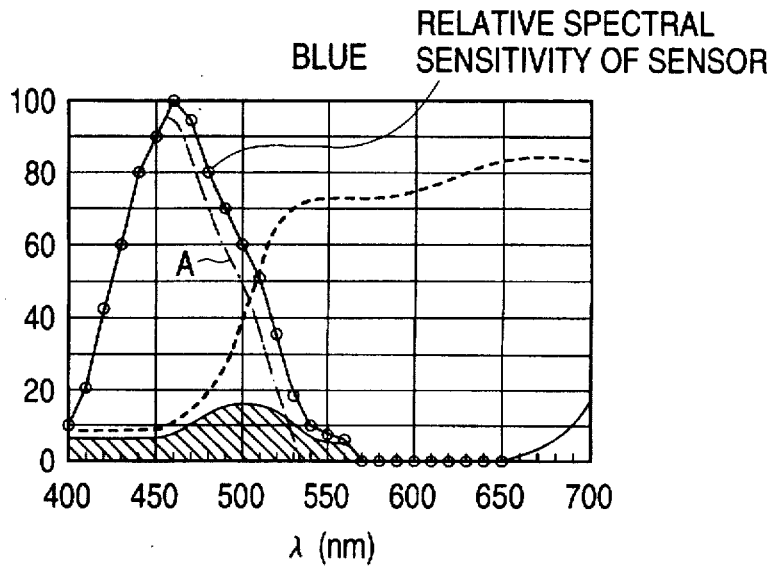

FIG. 6 is a block diagram showing the arrangement of the image processing section when the look-up table is not used. Like reference numerals in FIG. 6 refer to like elements in the embodiment as shown in FIG. 2. FIG. 7 is a flowchart showing the correcting operation in a usual copying operation when the look-up table is not used.

In the embodiment shown in FIG. 6, instead of the look-up table, a b* correction circuit 27a having a comparison and a multiplication function is provided.

The b* correction circuit 27a compares the value of the output b* supplied from the first color comparison section 25 with "96" (step 201). If b*≧96, the circuit 27a performs the following operation (step 202):

$$b^{*'}=[(b^{*}-96) \times \alpha i]+96$$

The b* correction circuit 27a supplies the b*' output to the second color conversion section 30. If b*<96, the b* correction circuit 27a outputs b* as it is.

In such a construction, the same processing as in the embodiment of FIG. 2 can be carried out. Incidentally, although the operating of calculating b*' consists of multiplication and addition, the multiplication is realized by combining additions so that the operation of calculating b*' can be carried out only the function of multiplication.

The function of the b* correction circuit 27a may be implemented in software by the CPU 28. An example of the program in this case will be shown below.

if b*−96≧0
$b^{*'}=[(b^{*}-96) \times \alpha i]+96$
else
$b^{*'}=b^{*}$ where αi represents a correction coefficient of i=1 to 9, b* represents data before correction which can take the value of 0 to 255, and b*' represents data after correction which can take the value of 0 to 255.

In the embodiments described above, the present invention was applied to the full-color copier. The present invention, however, may also be applied to the image reading device in an network system.

What is claimed is:

1. A color image reading device having color conversion means for reading a color document by an image sensor to obtain signals in an RGB color display system and converting the signals into signals in an L*a*b* color display system, said color image reading device comprising:

comparison means for comparing only a value of a b* signal in the L*a*b* color display system obtained by reading a standard document with a predetermined reference value of the b* signal, wherein said standard document includes a plurality of color patches for calibrating a plurality of reference values; and a color correction processing section provided at a stage after said color conversion means and having an input/output characteristic controlled in accordance with an output from said comparison means.

2. The color image reading device according to claim 1, wherein said color correction processing section selectively performs correction processing using a predetermined threshold value.

3. A color image reading device comprising:

image reading means having an RGB color filter for color separation of a document;

separation means for separating the document into signals in an RGB color display system;

conversion means for converting the signals in the RGB color display system into signals in an L*a*b* color display system;

correction means for correcting only a b* signal of the signals in the L*a*b* color display system; and means for changing a correction coefficient of said correction means in accordance with a difference between an output obtained by reading a standard document by said image reading means and a previously set reference value, wherein said standard document includes a plurality of color patches for calibrating a plurality of reference values.

4. A color image reading device comprising:

image reading means having an RGB color filter for color separation of a document;

separation means for separating the document into signals in an RGB color display system;

conversion means for converting the signals in the RGB color display system into signals in an L*a*b* color display system;

correction means for correcting only a b* signal of the signals in the L*a*b* color display system; and means for changing a correction coefficient of said correction means in accordance with a difference between an output obtained by reading a standard document by said image reading means and a previously set reference value.

5. The color image reading device according to claim 4, wherein the output obtained by reading the standard document is a yellow component output in the standard document through the RGB color filter.

6. The color image reading device according to claim 5, wherein only the b* signal of the signals in the L*a*b* color display system is corrected on the basis of the yellow component output.

* * * * *